United States Patent [19]
Akimoto et al.

[11] Patent Number: 5,278,778
[45] Date of Patent: Jan. 11, 1994

[54] DECENTRALIZED SIMULATOR

[75] Inventors: Yoshiakira Akimoto; Hideo Tanaka; Hiromi Ogi, all of Tokyo; Hisao Taoka; Toshiaki Sakaguchi, both of Amagasaki, all of Japan

[73] Assignees: Mitsubishi Denki Kabushiki Kaisha; The Tokyo Electric Power Co., Inc., Tokyo, Japan

[21] Appl. No.: 613,560
[22] PCT Filed: Jul. 20, 1990
[86] PCT No.: PCT/JP90/00940
 § 371 Date: Nov. 15, 1990
 § 102(e) Date: Nov. 15, 1990
[87] PCT Pub. No.: WO91/04600
 PCT Pub. Date: Apr. 4, 1991

[30] Foreign Application Priority Data
Sep. 21, 1989 [JP] Japan ............... 1-245493

[51] Int. Cl.$^5$ ............ H02J 3/00; G06F 15/20
[52] U.S. Cl. .................. 364/578; 364/492; 364/483
[58] Field of Search ...... 364/578, 483, 492, 801, 364/802, 803, 806; 395/500; 371/22.1

[56] References Cited
U.S. PATENT DOCUMENTS 4,766,534 8/1988 DeBenedictis ............ 395/500
5,032,789 7/1991 Firooz et al. ............ 371/22.1
5,050,069 9/1991 Hillis et al. ............ 395/500

FOREIGN PATENT DOCUMENTS
50-161651 12/1975 Japan.

OTHER PUBLICATIONS

Taoka et al; "Real-Time Digital Simulator for Power System Analyis on a Hypercube Computer"; IEEE vol. 7, No. 1 Feb. 1992.
Akimoto et al.; "Distributed Power System Simulation on a Hypercube Computer"; IFAC Sep. 26, 1989.
Lee et al; "Parallel Power System Transient Stability Analysis on Hypercube Multiprocessors"; IEEE Trans. Power Aug. 1991.

*Primary Examiner*—Jack B. Harvey
*Assistant Examiner*—Ellis B. Ramirez
*Attorney, Agent, or Firm*—Rothwell, Figg, Ernst & Kurz

[57] ABSTRACT

A decentralized simulator according to the invention has each processing unit arranged to each vertex in the hypercube structure and each communication line arranged to each side in the hypercube structure. Each component of the system to be simulated is assigned to each processing unit, and each processing unit communicates with other processing unit via communication line and operates concurrently with other processing unit. Since the decentralized simulator carries out the concurrent processing regarding each component, it is suitable for the simulation of the system such as power system including a number of components.

3 Claims, 5 Drawing Sheets

DECENTRALIZED SIMULATOR

TECHNICAL FIELD

The present invention relates to a simulator for simulating phenomenon of a system.

BACKGROUND ART

As an example of simulation in a simulator in the prior art, calculation of transient stability in an electric power system will be described based on a flow chart in FIG. 1. This is disclosed in the Transaction of the Institute of Electrical Engineers of Japan, May 1984, pp. 297–304, article 59-B36, "Calculation Method of High Speed Transient Stability Suitable for Array Processor".

In FIG. 1, reference numerals 41–51 designate respective steps in calculation of the transient stability. The calculation of the transient stability in an electric power system is in that system plan and working are carried out based on this, and two sets of equation, i.e., differential equation representing a generator and control system and algebraic equation representing relation of voltage and current in the power system, are solved in time sequence and alternately. Components to constitute the phenomenon of the power system include a generator, a generator bus connected to the generator, a non-generator bus being a load bus, excitation system constituted by an automatic voltage regulator, governor system constituted by a turbine, a power system stabilizer (hereinafter referred to as "PSS"), motion system and the like. Flow of the simulation is as shown in FIG. 1. That is, after the initial setting (step 41), calculation of the generator bus (step 42) and calculation of the non-generator bus (step 43) are carried out until attaining the convergence (step 44). If the convergence is the first time (step 45), calculation of each component is carried out in steps 47–51. After calculation of each component, process is returned to step 42. If the convergence is the second time or later, the convergence decision (step 46) is carried out and the simulation comes to the end in the case of the convergence.

Other simulation method is disclosed, for example, in "Denki Kyodo Kenkyu", Vol. 34, No. 5 (January 1979), p. 36.

As above described, simulation of phenomenon of the system in the prior art has been carried out in that each component is sequentially simulated by single processing unit.

Since the simulator in the prior art is constituted as above described, problems exist in that when the scale of the system and the number of components become large, enlargement or changing is difficult, and since the amount of processing becomes much, time to simulate the phenomenon of the system must be spent much.

DISCLOSURE OF INVENTION

In order to solve the above-mentioned problems in the prior art, an object of the invention is to provide a simulator wherein enlargement or changing of the system to be simulated can be carried out easily, and when the scale of the system and the number of the components become large, the number of processing units is increased, thereby the time required to simulate the phenomenon of the system can be prevented from increasing.

A decentralized simulator according to the invention is provided with a parallel processing computer having processing units arranged respectively to vertexes of the hypercube structure produced by increasing the vertexes recurrently as the number of dimensions increases and connecting the vertexes and having communication lines arranged respectively to sides of the hypercube structure, and the phenomenon of the system is divided into a plurality of components which are assigned to the processing units respectively, and the processing is carried out regarding the component to which each processing unit is assigned and the processing result is transferred by the communication lines thereby the phenomenon of the system is simulated.

In the simulator in the invention, a plurality of components are assigned and distributed respectively to the processing units and can be processed concurrently thereby the time required to simulate the phenomenon of the system can be reduced. Also if enlargement or changing of the scale of the system or the components is required, dimensions of the hypercube structure may be increased or decreased.

BEST MODE FOR CARRYING OUT THE INVENTION

An embodiment of the invention will now be described referring to the accompanying drawings.

Figure 1:
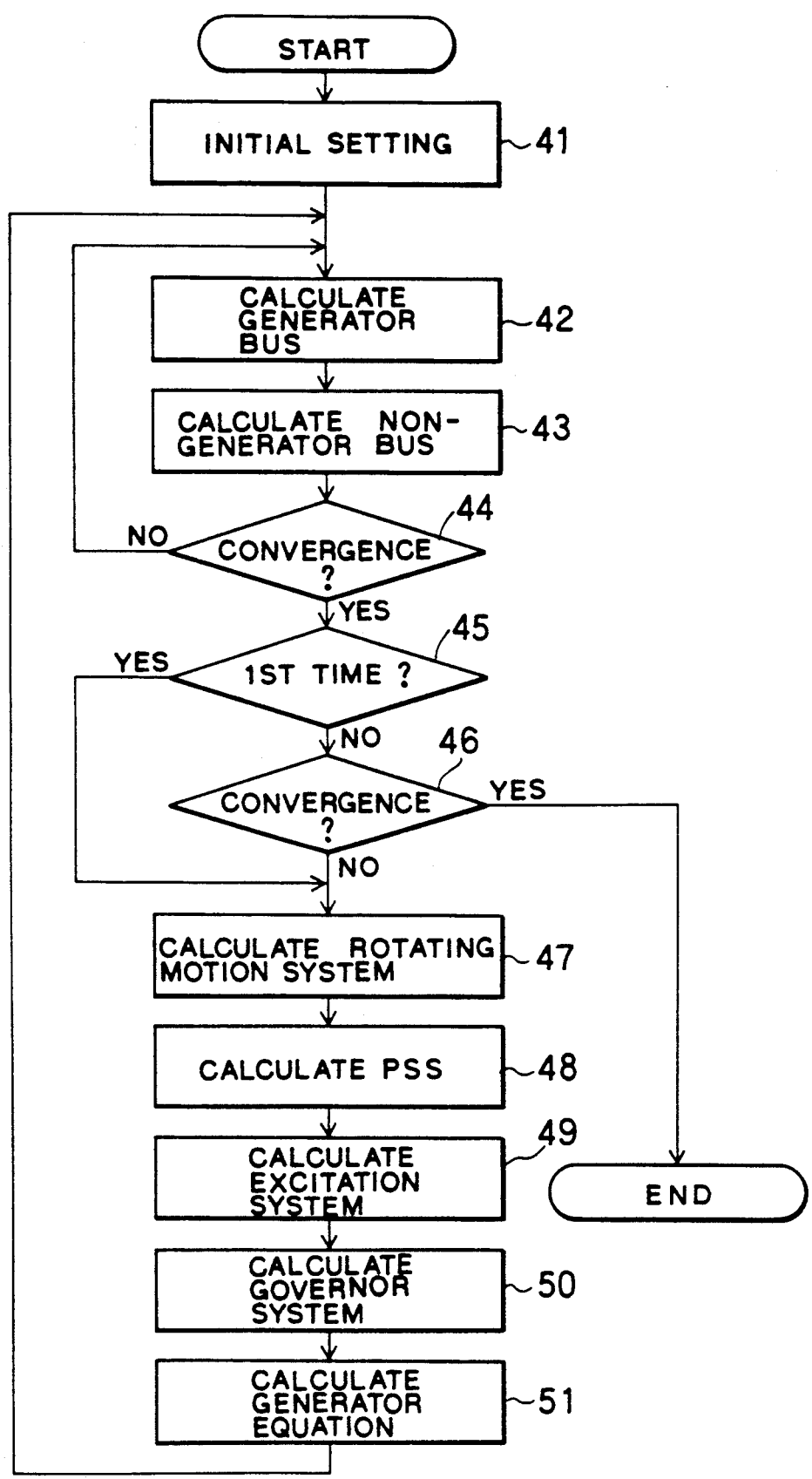
FIG. 1 is a flow chart showing flow of processing in a simulator in the prior art.
Figure 2:
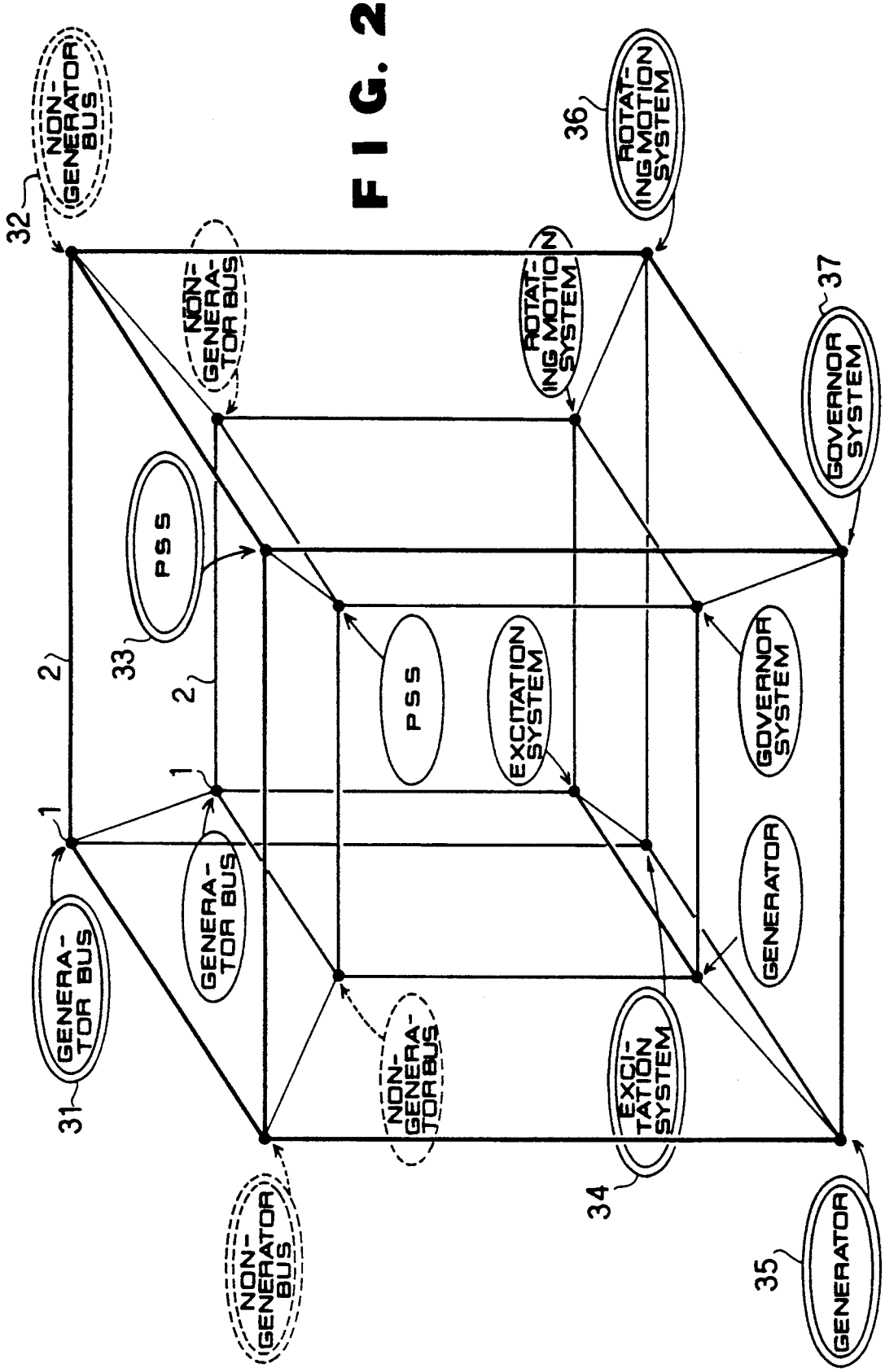
FIG. 2 is a constitution diagram showing a decentralized simulator as an embodiment of the invention.
Figure 4:
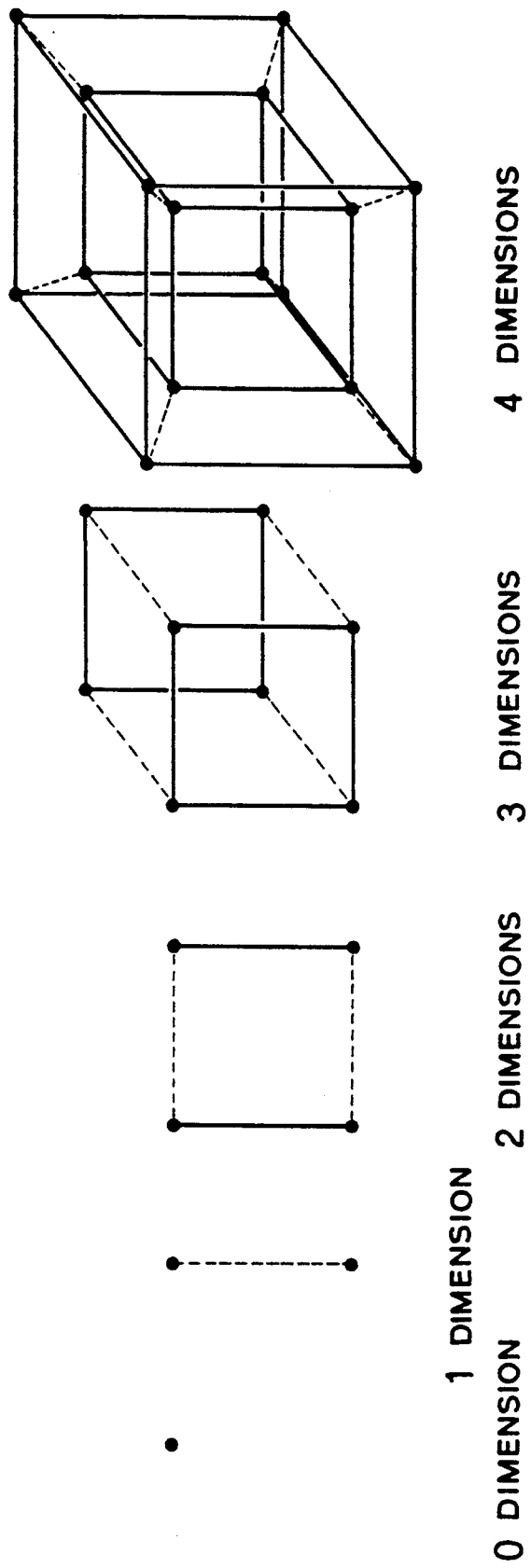
FIG. 4 is an explanation diagram illustrating hypercube structure.
Figure 5:
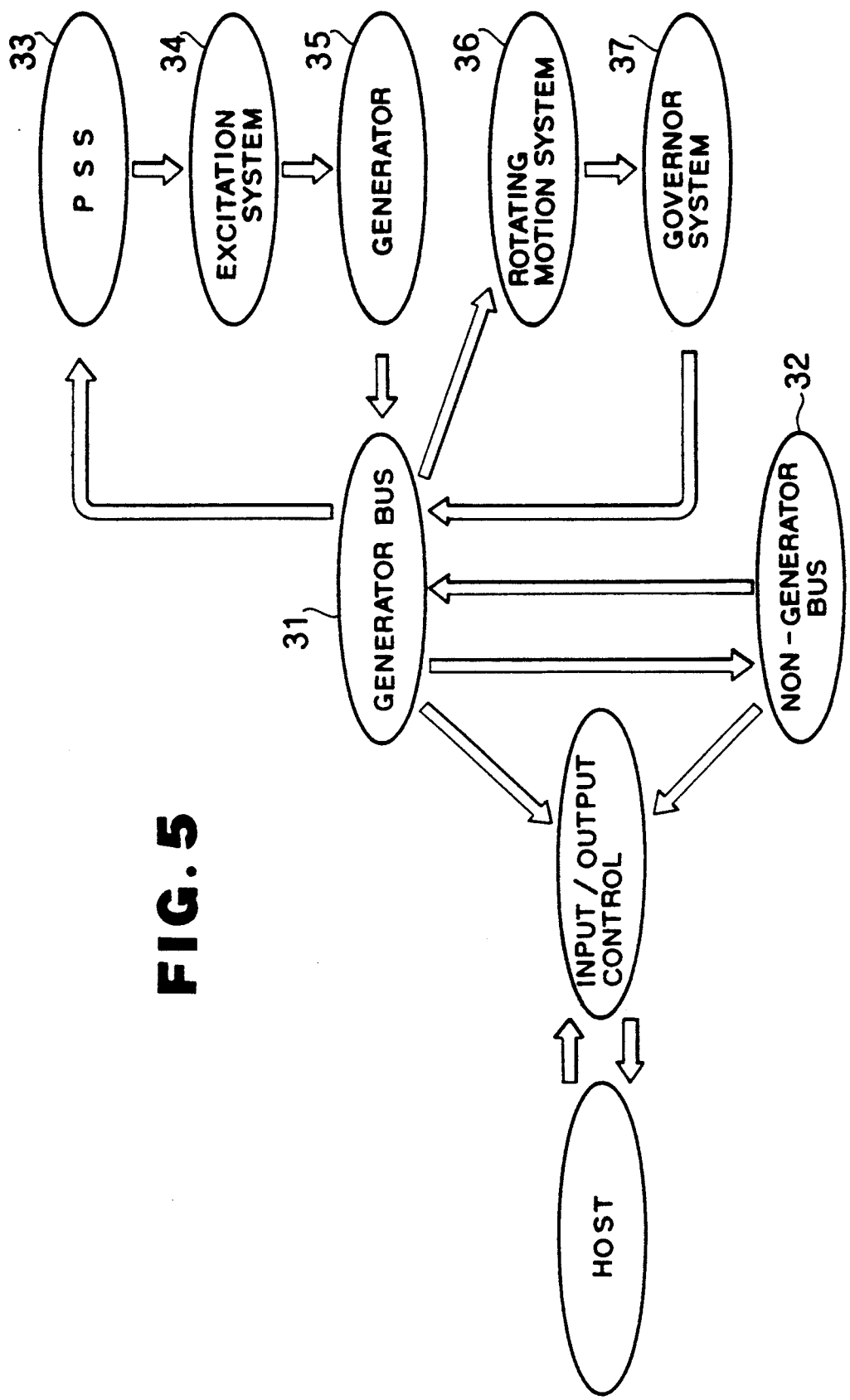
FIG. 5 is an explanation diagram illustrating relation of each component being phenomenon of the system.

FIG. 2 is a constitution diagram showing a decentralized simulator as an embodiment of the invention, and the simulator simulates a power system in similar manner to the prior art. In FIG. 2, reference numeral 1 designates a processing unit, reference numeral 2 designates a communication line for carrying out the communication between the processing unit, and reference numerals 31–37 designate respective components of the system where the phenomenon is simulated. In elliptic ornament showing each of the components 31–37, the same ornament indicates component relating to one generator bus (for example, component enclosed by double ellipsis relates to the generator bus enclosed by double ellipsis). FIG. 3(a),(b) each is a flow chart showing flow of operation regarding the embodiment, FIG. 4 is an explanation diagram illustrating the hypercube structure regarding the embodiment, and FIG. 5 is an explanation diagram illustrating relation of components of the system simulating the phenomenon.

Parallel processing computers mainly on the market in the present are broadly classified into a computer of common bus type holding a memory and a bus in common and a computer of network type represented by hypercube type.

The computer of network type has features in (1) that each processing unit has a memory independently, (2) that since each bus has an exclusive bus structure independently, there is no bottle neck in communication, and (3) that since a memory, a bus and a processing unit are independent from each other, there is no limitation in the number of the processing units.

In application to simulate the system such as a simulator, a parallel processing computer of network type is suitable. Particularly, a computer of hypercube type has structure including a lattice, a loop or the like, i.e., a network structure capable of being used for various purposes.

As shown in FIG. 4, the hypercube structure is a network produced in that vertexes are increased recurrently as the number of dimensions increases and the vertexes are connected to each other, and the hypercube structure is constituted by node of the power of 2. That is, the hypercube of n dimensions is constituted by node of $2^n$. One node is connected to other node with the n dimensions. Each node can communicates with any other node if it passes through n links at most.

Since the hypercube structure with four dimensions shown in FIG. 2 is constituted by 16 nodes at most and the components can be assigned to respective nodes, it can be applied to the simulation divided into 16 components at most.

In this embodiment, as shown in FIG. 5, the generator bus 31 is divided into mechanical system (motion system 36, governor system 37) and electrical system (PSS 33, excitation system 34, generator 35), and the control system is divided in each component. Also the power system is divided in each bus.

Figure 3:
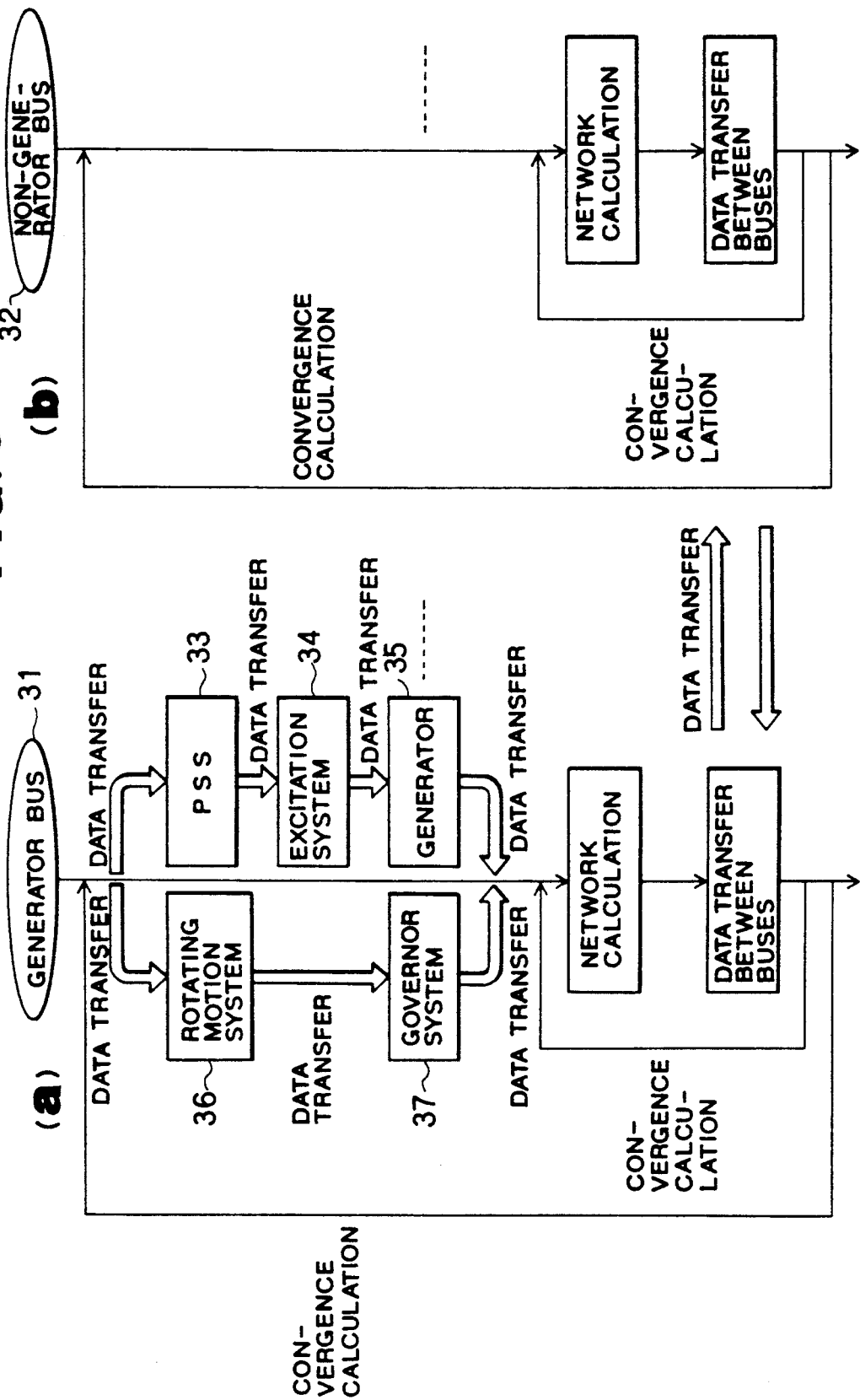
FIGS. 3(A and B) are flow charts showing flow of processing in each processing unit.

The procedure of the processing and communication in each bus during executing the simulation in one time step is as shown in a flow chart of FIG. 3. FIG. 3(a) is a flow chart in the generator bus 31, and FIG. 3(b) is a flow chart in the non-generator bus 32. In the solving process of the differential equation, as shown in the figure, the electrical system (PSS 33, excitation system 34, generator 35) and the mechanical system (motion system 36, governor system 37) in each generator bus 31 can be calculated concurrently. Since operation regarding the control system of such generator is executed in separate processing unit 1 respectively, the data transmission/receiving is necessary between these tasks. Also in the non-generator bus 32, the communication with the task to calculate dynamics is not required.

Thus each processing unit 1 simulates the phenomenon of each of the components 31-37 of the system while the data transfer is mutually carried out by the communication line 2.

Since the processing in each processing unit can be executed concurrently, the processing time can be reduced in comparison to the prior art.

In the embodiment, although the description has been carried out regarding the case that the system to be simulated is the power system, other system such as an electronic circuit or a plant may be simulated and similar effect to that of the embodiment can be obtained.

Also depending on the number of the divided components, the hypercube structure with 5 dimensions, 6 dimensions or the like can be easily constituted, and enlargement or changing of the system to be simulated becomes easy.

Industrial Applicability

According to the invention as above described, a simulator is provided with a parallel processing computer having processing units arranged respectively to vertexes of the hypercube structure produced by increasing the vertexes recurrently as the number of dimensions increases and connecting the vectexes and having communication lines arranged respectively to sides of the hypercube structure, and the phenomenon of the system is divided into a plurality of components which are assigned to the processing units respectively, and the processing is carried out regarding the component to which each processing unit is assigned and the phenomenon of the system is distributed and simulated, thereby the simulator can easily enlarge or change the system to be simulated and is provided with the antifailure property and flexibility and also can simulate the system at high speed.

What is claimed is:

1. A decentralized simulator for processing the simulation of an electric power system comprising a parallel processing computer having processing units arranged respectively to vertexes of the hypercube structure produced by increasing the vertexes recurrently as the number of dimensions increases and said parallel processing computer connecting the vertexes to each other and having communication lines arranged respectively to sides of the hypercube structure, wherein the power system is divided into a plurality of components for the parallel processing simulation thereof, said components including the mechanical portion of said power system having a rotation motion system and a governor system, the electrical portion of said power system having a power system stabilizer, power generating means and an excitation system, a generator bus, and a non-generator bus, said components being assigned to said processing units respectively for carrying out parallel processing of the simulation with respect to each component to which each processing unit is assigned, the processing results of each of said processing units being transferred and delivered by said interconnecting communication lines, whereby the parameters of the electric power system are distributed and simulated by parallel processing carried out by said processing units.

2. A decentralized simulator as set forth in claim 1, wherein each processing unit assigned to the mechanical system and each processing unit assigned to the electrical system carry out the processing concurrently.

3. A decentralized simulator as set forth in claim 2, wherein plural sets each including the mechanical system, the electrical system, the generator bus and the non-generator bus exist as the components of the system.

* * * * *